United States Patent
Gao et al.

(10) Patent No.: US 8,837,180 B2
(45) Date of Patent: Sep. 16, 2014

(54) POWER SUPPLY SWITCH APPARATUS

(75) Inventors: Zhi-Yong Gao, Wuhan (CN); Yun-Fei Zhang, Wuhan (CN); Yu-Lin Liu, Wuhan (CN)

(73) Assignees: Hong Fu Jin Precision Industry (WuHan) Co., Ltd., Wuhan (CN); Hon Hai Precision Industry Co., Ltd., New Taipei (TW)

( * ) Notice: Subject to any disclaimer, the term of this patent is extended or adjusted under 35 U.S.C. 154(b) by 64 days.

(21) Appl. No.: 13/563,814

(22) Filed: Aug. 1, 2012

(65) Prior Publication Data
US 2013/0155743 A1 Jun. 20, 2013

(30) Foreign Application Priority Data
Dec. 20, 2011 (CN) .......................... 2011 1 0429468

(51) Int. Cl.
*H02M 7/00* (2006.01)
*G01R 31/28* (2006.01)

(52) U.S. Cl.
USPC .......................... 363/84; 363/125; 307/132 E

(58) Field of Classification Search
CPC ......... H02M 7/02; H02M 7/06; H02M 7/066; H02M 2007/02
USPC .............. 363/84, 125, 126; 307/132 R, 132 E
See application file for complete search history.

(56) References Cited

U.S. PATENT DOCUMENTS 4,472,672 A * 9/1984 Pacholok ....................... 320/145
8,233,301 B1 * 7/2012 Guo ............................... 363/140

FOREIGN PATENT DOCUMENTS

CN          201590645 U     9/2010

* cited by examiner

*Primary Examiner* — Gary L Laxton
(74) *Attorney, Agent, or Firm* — Novak Druce Connolly Bove + Quigg LLP

(57) ABSTRACT

A power supply switch apparatus includes a voltage decreasing circuit, a rectification circuit, a comparison circuit, and a control circuit. The voltage decreasing circuit receives a first alternating voltage output from a power supply and converts the first alternating voltage to a second alternating voltage. The rectification circuit receives the second alternating voltage and converts the second alternating voltage to a first direct voltage. The voltage regulating circuit receives the first direct voltage and converts the first direct voltage to a second direct voltage. The comparison circuit receives the second direct voltage, compares the second direct voltage with a reference voltage, and outputs a control signal. The control circuit receives the control signal and connects the power supply to different circuits according to the control signal.

16 Claims, 3 Drawing Sheets

POWER SUPPLY SWITCH APPARATUS

BACKGROUND

1. Technical Field

The present disclosure relates to switch apparatuses, and particularly a power supply switch apparatus.

2. Description of Related Art

A switch circuit is generally used in a testing for a power supply. When the power supply is tested, the switch circuit connects the power supply to different circuits according to different input voltages of the power supply. FIG. 1 shows a common switch circuit. When an alternating voltage 10 outputs a low voltage, a switch S is closed, and a first return circuit, formed by a thermistor RT, a first resistor R13, a second resistor R14, and a first diode D13, outputs a direct voltage Vout. When the alternating voltage 10 outputs a high voltage, the switch S must be opened, so as to form a second return circuit by the thermistor RT, a second diode D12, resistors R11-R14, and the diode D13, which outputs the direct voltage Vout.

However, the switch S is opened or closed by manual operation, which is inconvenient and time consuming.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 2:
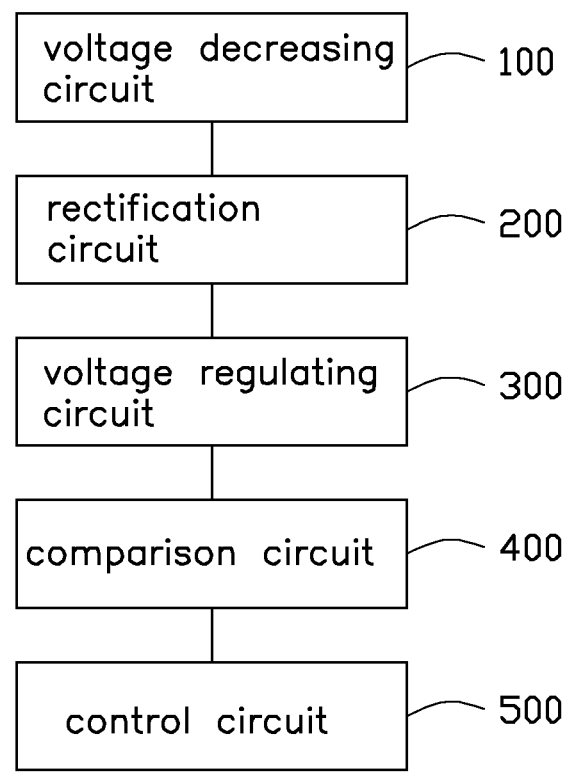
FIG. 2 is a block diagram of one embodiment of a power supply switch apparatus.

FIG. 2 shows a power supply switch apparatus in accordance with an embodiment. The power supply switch apparatus includes a voltage decreasing circuit 100, a rectification circuit 200, a voltage regulating circuit 300, a comparison circuit 400, and a control circuit 500.

The voltage decreasing circuit 100 receives a first alternating voltage and converts the first alternating voltage to a second alternating voltage. The rectification circuit 200 receives the second alternating voltage and converts the second alternating voltage to a first direct voltage. The voltage regulating circuit 300 receives the first direct voltage and converts the first direct voltage to a second direct voltage. The comparison circuit 400 outputs a control signal after comparing the second direct voltage with a reference voltage. The control circuit 500 receives the control signal and operates the power supply according to the control signal.

Figure 3:
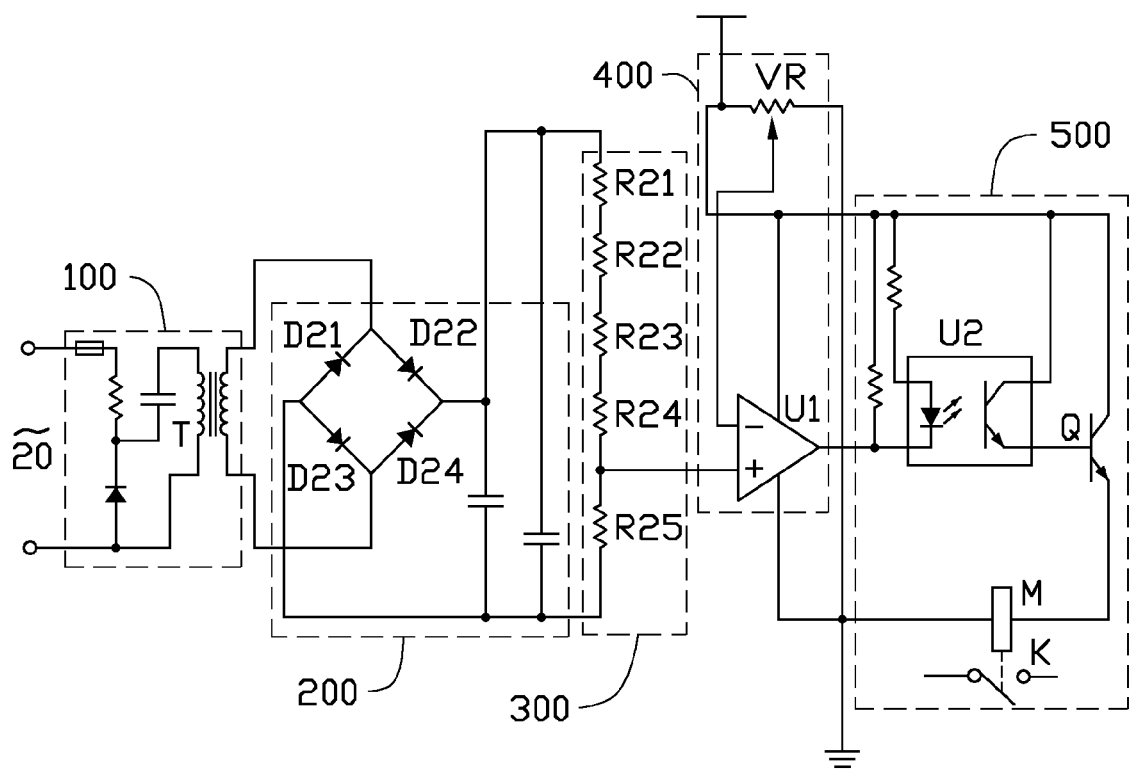
FIG. 3 is a circuit diagram of the power supply switch apparatus of FIG. 1.

FIG. 3 shows the voltage decreasing circuit 100 including a transformer T. The transformer T receives the first alternating voltage from an alternating power 20 and outputs the second alternating voltage.

The rectification circuit 200 includes a first diode D21, a second diode D22, a third diode D23, and a fourth diode D24. A first cathode of the first diode D21 connects a second anode of the second diode D22. A first anode of the first diode D21 connects a third anode of the third diode D23. A third cathode of the third diode D23 connects the fourth anode of the fourth diode D24. A first connection point of the first cathode of the first diode D21 and the second anode of the second diode D22 connect the transformer T and receive the second alternating voltage. A second connection point of the third cathode of the third diode D23 and the four anode of the fourth diode D24 connect the transformer T and receive the second alternating voltage. A third connection point of the first anode of the first diode D21 and the third anode of the third diode D23 output the first direct voltage. A fourth connection point of the second cathode of the second diode D22 and the fourth cathode of the fourth diode D24 output the first direct voltage.

The voltage regulating circuit 300 includes a first plurality of resistors R21-R25. The fourth connection point connects to the first connection point through the first plurality of resistors R21-R25 in order. A connection point of the resistors R24 and R25 outputs the second direct voltage. Each of the first plurality of resistors R21-R25 has an equal resistor value.

The comparison circuit 400 includes a comparator U1 and a variable resistor VR. The variable resistor VR includes a first end, a second end, and an adjusting end. The first end receives a third direct voltage. The second end connects to ground. An in-phase input end of the comparator U1 connects the connection point of the resistors R24 and R25. An anti-phase input end of the comparator U1 connects the adjusting end of the variable resistor VR and receives the reference voltage. An output end of the comparator U1 outputs the control signal. In one embodiment, the third direct voltage is +5V. The reference voltage is +2.5V. The low voltage is 90 V~115 V. The high voltage is 220 V~264 V. The reference voltage can be adjusted according to the low voltage and the high voltage by adjusting the adjusting end of the variable resistor VR.

The control circuit 500 includes an optoelectronic coupler U2, a transistor Q, and a relay (not labeled). The optoelectronic coupler U2 includes a flash unit and a first switch unit. The relay includes a coil unit M and a second switch unit K. A cathode of the flash unit connects to the output end of the comparator U1 and receives the control signal. An anode of the flash unit receives the third direct voltage. One end of the first switch unit receives the third direct voltage. Another end of the first switch unit connects a base of the transistor Q. An emitter of the transistor Q connects to the ground through the coil unit M. A collector of the transistor Q receives the third direct voltage. In one embodiment, the transistor Q is NPN typed.

In use, when the first alternating voltage output from the alternating power 20 is a low voltage, taking 110 V for example, the 110 V first alternating voltage decreases into 6V second alternating voltage. The 6V second alternating voltage converts to a +8V first direct voltage through the first diode D21, the second diode D22, the third diode D23, and the fourth diode D24. The +8V first direct voltage is decreased to a +1.6V second direct voltage through regulating by the first plurality of resistors R21~R25. Because the +1.6V second direct voltage is lower than the +2.5V reference voltage, the output end of the comparator U1 outputs a low level control signal. The flash unit of the optoelectronic coupler U2 lights. The first switch unit of the optoelectronic coupler U2 is on, so that the base of the transistor Q receives the +5V third direct voltage and is on. The coil unit M is power on by receiving the +5V third direct voltage. The second switch unit K is closed by the coil unit M.

When the first alternating voltage output from the alternating power 20 is a high voltage, taking 220 V for example, the 220 V first alternating voltage decreases into a 12V second alternating voltage. The 12V second alternating voltage converts to a +16V first direct voltage through the first diode D21, the second diode D22, the third diode D23, and the fourth diode D24. The +16V first direct voltage is decreased to a +1.6V second direct voltage through regulating by the first plurality of resistors R21~R25. Because the +3.2V second direct voltage is greater than the +2.5V reference voltage, the output end of the comparator U1 outputs a high level control signal. The flash unit of the optoelectronic coupler U2 is off. The first switch unit of the optoelectronic coupler U2 is off, so that the base of the transistor Q is off. The coil unit M is powered off. The second switch unit K is opened.

Figure 1:
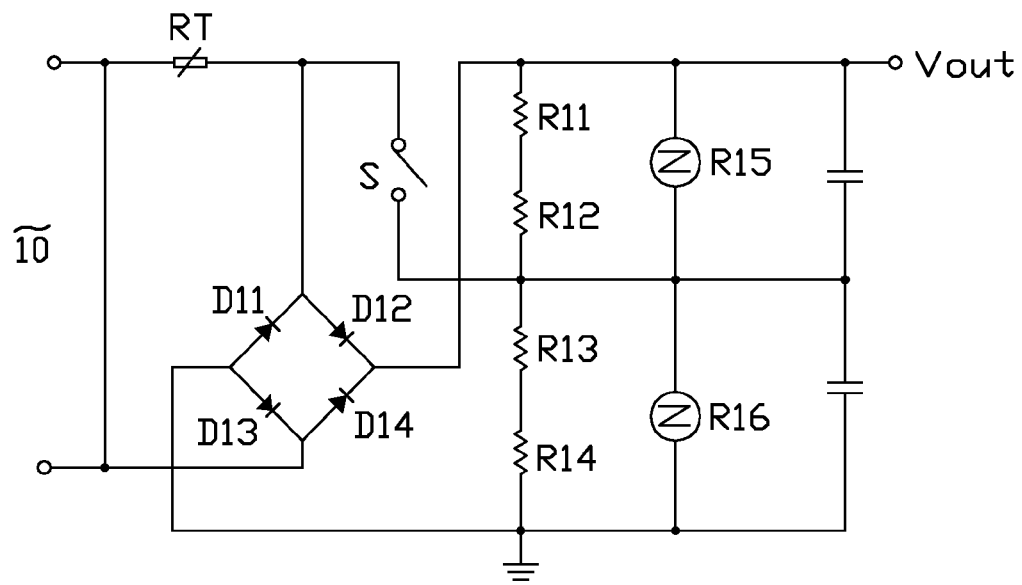
FIG. 1 is a circuit diagram of a switch circuit of related art.

The second switch K can be used as the switch S of FIG. 1, so that the switch S can be automatically adjusted between opened and closed according to the voltage output from the alternating voltage 10.

It is to be understood, however, that even though numerous characteristics and advantages have been set forth in the foregoing description of embodiments, together with details of the structures and functions of the embodiments, the disclosure is illustrative only and changes may be made in detail, especially in the matters of shape, size, and arrangement of parts within the principles of the disclosure, to the full extent indicated by the broad general meaning of the terms in which the appended claims are expressed.

What is claimed is:

1. A power supply switch apparatus comprising:
   a voltage decreasing circuit receiving a first alternating voltage output from a power supply and converting the first alternating voltage to a second alternating voltage;
   a rectification circuit receiving the second alternating voltage and converting the second alternating voltage to a first direct voltage;
   a voltage regulating circuit receiving the first direct voltage and converting the first direct voltage to a second direct voltage;
   a comparison circuit receiving the second direct voltage and comparing the second direct voltage with a reference voltage and outputting a control signal; and
   a control circuit receiving the control signal and connecting the power supply to different circuits according to the control signal;
   wherein the voltage regulating circuit comprises at least a first resistor and a second resistor; and the connection point of the first resistor and the second resistor outputs the second direct voltage; the comparison circuit comprises a comparator and a variable resistor; the variable resistor comprises a first end, a second end, and an adjusting end; the first end receives a third direct voltage; the second end connects to ground; an in-phase input end of the comparator connects the connection point of the first resistor and the second resistor; an anti-phase input end of the comparator connects the adjusting end of the variable resistor and receives the reference voltage; and an output end of the comparator outputs the control signal.

2. The power supply switch apparatus of claim 1, wherein the voltage decreasing circuit comprises a transformer, the transformer receives the first alternating voltage and outputs the second alternating voltage.

3. The power supply switch apparatus of claim 2, wherein the rectification circuit comprises a first diode, a second diode, a third diode, and a fourth diode; a first cathode of the first diode connects a second anode of the second diode; a first anode of the first diode connects a third anode of the third diode; a third cathode of the third diode connects the fourth anode of the fourth diode; a first connection point of the first cathode of the first diode and the second anode of the second diode connects the transformer and receive the second alternating voltage; a second connection point of the third cathode of the third diode and the four anode of the fourth diode connects the transformer and receive the second alternating voltage; a third connection point of the first anode of the first diode and the third anode of the third diode outputs the first direct voltage; a fourth connection point of the second cathode of the second diode and the fourth cathode of the fourth diode outputs the first direct voltage.

4. The power supply switch apparatus of claim 3, wherein the fourth connection point connects the first connection point through the first resistor and the second resistor in order.

5. The power supply switch apparatus of claim 1, wherein the control circuit comprises an optoelectronic couplers, a transistor, and a relay; the optoelectronic coupler comprises a flash unit and a first switch unit; the relay comprises a coil unit and a second switch unit; a cathode of the flash unit connects the output end of the comparator and receives the control signal; an anode of the flash unit receives the third direct voltage; one end of the switch unit receives the third direct voltage; another end of the switch unit connects a base of the transistor; an emitter of the transistor connects to the ground through the coil unit; a collector of the transistor receives the third direct voltage.

6. The power supply switch apparatus of claim 5, wherein the second switch unit is an often closed typed switch; the coil unit controls the second switch unit to be opened or closed, so as to connect the power supply to different circuits.

7. The power supply switch apparatus of claim 5, wherein the transistor is NPN typed.

8. The power supply switch apparatus of claim 1, wherein first value of the first resistor is equal to a second value of the second resistor.

9. A power supply switch apparatus comprising:
   a voltage decreasing circuit receiving a first alternating voltage output from a power supply and converting the first alternating voltage to a second alternating voltage;
   a rectification circuit receiving the second alternating voltage and converting the second alternating voltage to a first direct voltage;
   a voltage regulating circuit receiving the first direct voltage and converting the first direct voltage to a second direct voltage;
   a comparison circuit receiving the second direct voltage and comparing the second direct voltage with a reference voltage and outputting a control signal; and
   a control circuit comprising a relay and receiving the control signal, and the control signal controlling the relay to be opened or closed, so as to connect the power supply to different circuits;
   wherein the voltage regulating circuit comprises at least a first resistor and a second resistor; and
   the connection point of the first resistor and the second resistor outputs the second direct voltage; the comparison circuit comprises a comparator and a variable resistor; the variable resistor comprises a first end, a second end, and an adjusting end; the first end receives a third direct voltage; the second end connects to ground; an in-phase input end of the comparator connects the connection point of the first resistor and the second resistor; an anti-phase input end of the comparator connects the adjusting end of the variable resistor and receives the reference voltage; and an output end of the comparator outputs the control signal.

10. The power supply switch apparatus of claim 9, wherein the voltage decreasing circuit comprises a transformer, the transformer receives the first alternating voltage and outputs the second alternating voltage.

11. The power supply switch apparatus of claim 10, wherein the rectification circuit comprises a first diode, a second diode, a third diode, and a fourth diode; a first cathode of the first diode connects a second anode of the second diode; a first anode of the first diode connects a third anode of the third diode; a third cathode of the third diode connects the fourth anode of the fourth diode; a first connection point of the first cathode of the first diode and the second anode of the second diode connects the transformer and receive the second alternating voltage; a second connection point of the third cathode of the third diode and the four anode of the fourth diode connects the transformer and receive the second alternating voltage; a third connection point of the first anode of the first diode and the third anode of the third diode outputs the first direct voltage; a fourth connection point of the second cathode of the second diode and the fourth cathode of the fourth diode outputs the first direct voltage.

12. The power supply switch apparatus of claim 11, wherein the fourth connection point connects the first connection point through the first resistor and the second resistor in order.

13. The power supply switch apparatus of claim 9, wherein the control circuit further comprises an optoelectronic couplers and a transistor; the optoelectronic coupler comprises a flash unit and a first switch unit; the relay comprises a coil unit and a second switch unit; a cathode of the flash unit connects the output end of the comparator and receives the control signal; an anode of the flash unit receives the third direct voltage; one end of the switch unit receives the third direct voltage; another end of the switch unit connects a base of the transistor; an emitter of the transistor connects to the ground through the coil unit; a collector of the transistor receives the third direct voltage.

14. The power supply switch apparatus of claim 13, wherein the second switch unit is an often closed typed switch; the coil unit controls the second switch unit to be opened or closed, so as to connect the power supply to different circuits.

15. The power supply switch apparatus of claim 13, wherein the transistor is NPN typed.

16. The power supply switch apparatus of claim 9, wherein a first value of the first resistor is equal to a second value of the second resistor.

* * * * *